(12) United States Patent
Uh et al.

(10) Patent No.: US 7,829,638 B2
(45) Date of Patent: *Nov. 9, 2010

(54) ANTIREFLECTIVE HARDMASK COMPOSITION AND METHODS FOR USING SAME

(75) Inventors: Dong Seon Uh, Seoul (KR); Chang Il Oh, Gyeonggi-Do (KR); Do Hyeon Kim, Gyeonggi-Do (KR); Jin Kuk Lee, Gyeonggi-Do (KR); Irina Nam, Gyeonggi-Do (KR)

(73) Assignee: Cheil Industries, Inc. (KR)

( * ) Notice: Subject to any disclaimer, the term of this patent is extended or adjusted under 35 U.S.C. 154(b) by 605 days.

This patent is subject to a terminal disclaimer.

(21) Appl. No.: 11/348,203

(22) Filed: Feb. 6, 2006

(65) Prior Publication Data

US 2006/0251990 A1     Nov. 9, 2006

(30) Foreign Application Priority Data

May 9, 2005   (KR) ...................... 10-2005-0038406
Jul. 27, 2005  (KR) ...................... 10-2005-0068348

(51) Int. Cl.
*G03F 7/11*   (2006.01)
*G03F 7/039*  (2006.01)

(52) U.S. Cl. .................. 525/485; 430/271.1; 525/482; 525/486; 525/491; 525/494

(58) Field of Classification Search ........................ None
See application file for complete search history.

(56) References Cited

U.S. PATENT DOCUMENTS

| 5,132,349 | A | * | 7/1992 | Iimuro et al. ............... 524/265 |
|---|---|---|---|---|
| 5,420,233 | A | | 5/1995 | Isogai et al. |
| 5,886,102 | A | | 3/1999 | Sinta et al. |
| 5,939,236 | A | | 8/1999 | Pavelchek et al. |
| 7,378,217 | B2 | * | 5/2008 | Oh et al. .................. 430/270.1 |
| 7,405,029 | B2 | * | 7/2008 | Oh et al. .................. 430/270.1 |
| 7,514,199 | B2 | * | 4/2009 | Uh et al. .................. 430/270.1 |
| 2004/0110084 | A1 | * | 6/2004 | Inomata et al. .......... 430/270.1 |
| 2006/0269867 | A1 | | 11/2006 | Uh et al. |
| 2007/0003863 | A1 | | 1/2007 | Uh et al. |
| 2007/0059635 | A1 | | 3/2007 | Oh et al. |
| 2007/0072111 | A1 | | 3/2007 | Oh et al. |
| 2007/0154658 | A1 | | 7/2007 | Kang et al. |

FOREIGN PATENT DOCUMENTS

| CA | 1204547 A1 | | 5/1986 |
|---|---|---|---|
| EP | 0 491 045 A1 | * | 1/1992 |
| GB | 2 003 896 A | * | 3/1979 |
| JP | 06-136122 A | | 5/1994 |
| JP | 9-146100 A | | 6/1997 |
| JP | 11-084391 A | | 3/1999 |

OTHER PUBLICATIONS

RN 26834-20-6, REgistry, ACS on STN, etnered Nov. 16, 1984, two pages.*

* cited by examiner

*Primary Examiner*—Cynthia Hamilton
(74) *Attorney, Agent, or Firm*—Myers Bigel Sibley & Sajovec, PA

(57) ABSTRACT

Hardmask compositions having antireflective properties useful in lithographic processes, methods of using the same, and semiconductor devices fabricated by such methods, are provided.

12 Claims, 2 Drawing Sheets

ANTIREFLECTIVE HARDMASK COMPOSITION AND METHODS FOR USING SAME

CROSS-REFERENCE TO RELATED PATENT APPLICATIONS

This application claims the benefit of Korean Patent Application Nos. 10-2005-0038406, filed on May 9, 2005, and 10-2005-0068348, filed on Jul. 27, 2005, in the Korean Intellectual Property Office, the disclosure of which is incorporated herein in its entirety by reference.

FIELD OF THE INVENTION

The present invention relates to hardmask compositions having antireflective properties useful in lithographic processes, and more particularly to hardmask compositions including polymers having strong absorbance in the short wavelength region (e.g., 157, 193 and 248 nm) of the electromagnetic spectrum.

BACKGROUND OF THE INVENTION

Due to the continuous demand for smaller microelectronic devices, there exists a need to reduce the size of structural shapes in microelectronics and other related industries. Toward this end, effective lithographic techniques are essential to achieve a reduction in the size of microelectronic structures.

Typical lithographic processes involve pattern-wise exposure of a photosensitive resist to radiation in order to form a patterned resist layer. Thereafter, the resulting image may be developed by contacting the exposed resist layer with a suitable developing substance (e.g. an aqueous alkaline developing solution) to remove certain portions of the resist pattern. The material underlying the resist may then be etched through the openings in the resist to transfer a pattern to an underlying substrate. After the pattern is transferred, the remaining portions of the resist may then be removed.

For better resolution in lithography, an antireflective coating (ARC) may be used to minimize the reflectivity between an imaging layer, such as a photosensitive resist, and an underlying layer. However, in some lithographic imaging processes, the resist does not provide sufficient etch resistance to effectively transfer the desired pattern to a layer underlying the resist. Therefore, a so-called hardmask layer may be applied as an intermediate layer between the patterned resist layer and the underlying material to be patterned. The hardmask layer receives the pattern from the patterned resist layer and should be able to withstand the etching processes needed to transfer the pattern to the underlying material.

Although a number of hardmask materials are known, there is a need for improved hardmask compositions. Since conventional hardmask materials are often difficult to apply to substrates, the use of chemical and physical vapor deposition, special solvents, and/or high-temperature baking may be required. A hardmask composition that may be applied by spin-coating techniques, and which does not require high-temperature baking, would be desirable. A hardmask composition that can be easily etched selective to the overlying photoresist, while being resistant to the etch process needed to pattern the underlying layer, would also be desirable. A hardmask composition that provides superior storage properties and avoids unwanted interactions with an imaging resist layer would further be desirable. A hardmask composition that is particularly resistant to radiation at shorter wavelengths, such as 157, 193, and 247 nm, would also be desirable.

SUMMARY OF THE INVENTION

In some embodiments of the present invention, antireflective hardmask compositions include:

a) a polymer component, which includes one or more of the monomeric units of Formulas I, II and III:

Formula (I)

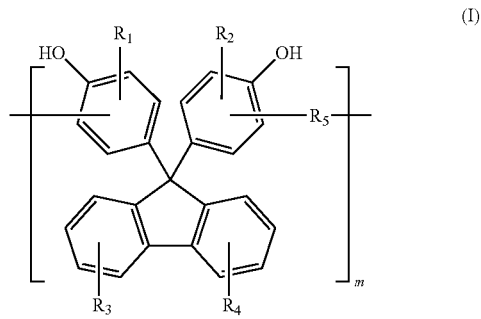

wherein $R_1$ and $R_2$ may each independently be hydrogen, hydroxyl, alkyl, aryl, allyl, halo or any combination thereof; and $R_3$ and $R_4$ may each independently be hydrogen, a crosslinking functionality, a chromophore or any combination thereof; and $R_5$ may be phenylalkylene, phenyldialkylene or biphenyldialkylene, and m is a positive integer;

Formula (II)

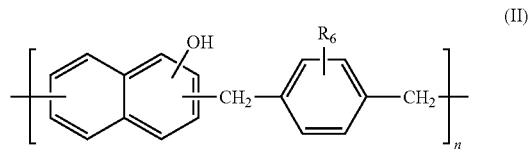

wherein $R_6$ may be hydrogen, alkyl, aryl, allyl or any combination thereof, and n is a positive integer; and Formula (III)

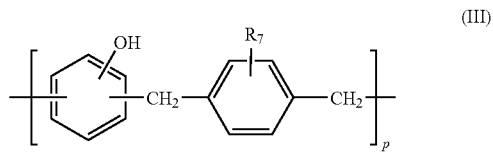

wherein $R_7$ may be hydrogen, alkyl, aryl, allyl or any combination thereof, and p is a positive integer; and b) a crosslinking component; and c) an acid catalyst.

In some embodiments of the present invention, methods of forming a patterned material layer on a substrate include (a) forming an antireflective hardmask layer on a material layer, wherein said hardmask layer includes a composition described above;

(b) forming a radiation-sensitive imaging layer on the antireflective layer;

(c) exposing the imaging layer to radiation;

(d) developing the imaging layer and the antireflective layer to expose portions of the material layer; and (e) etching the exposed portions of the material layer.

Further, in some embodiments of the invention, a semiconductor integrated circuit fabricated according to a method of the invention is provided.

DETAILED DESCRIPTION OF EMBODIMENTS OF THE INVENTION

Figure 1:
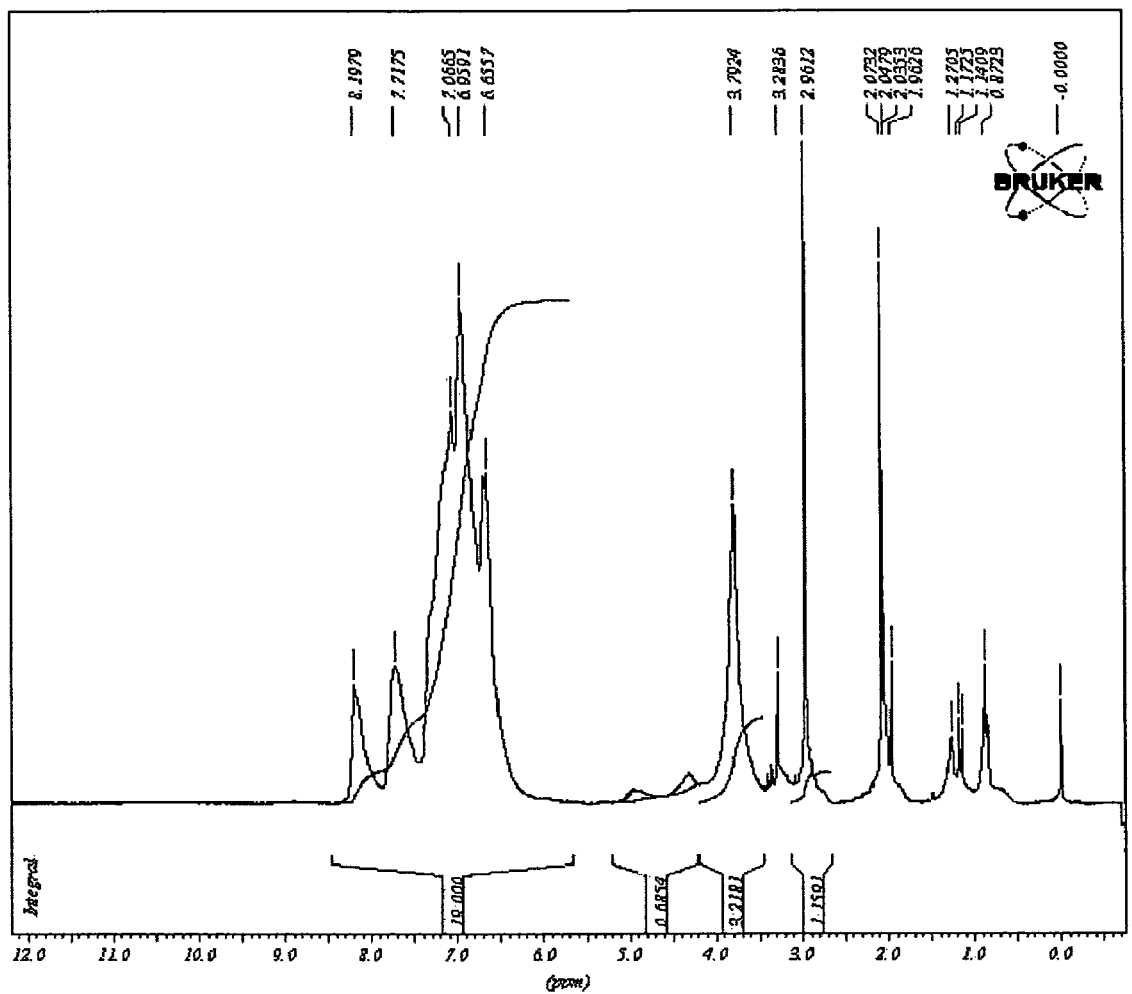
FIG. 1 is an 1H NMR spectrum of the polymer prepared in Example 2.

The invention is described more fully hereinafter. This invention may, however, be embodied in many different forms and should not be construed as limited to the embodiments set forth herein. Rather, these embodiments are provided so that this disclosure will be thorough and complete, and will fully convey the scope of the invention to those skilled in the art.

It will be understood that when an element or layer is referred to as being "on," another element or layer, it can be directly on, connected to, or coupled to the other element or layer, or intervening elements or layers may be present. In contrast, when an element is referred to as being "directly on," "directly connected to," or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein:

The term "halo" refers to a halogen radical, including —F, —Cl, I and Br.

The term "allyl" refers to a —$CH_2$—CH=$CH_2$ radical.

The term "epoxy" refers to a functional group wherein an oxygen atom is directly attached to two carbon atoms already forming part of a ring system or to two carbon atoms of a chain.

The term "ester" refers to a —C(=O)OR radical, wherein R is an alkyl or aryl group, as defined herein.

The term "alkoxy" refers to a —OR radical, wherein R is an alkyl or aryl group, as defined herein.

The terms "alkyl" and "alkylene" refer to a monovalent or bivalent (respectively) straight, branched, or cyclic hydrocarbon radical having from 1 to 12 carbon atoms. In some embodiments, the alkyl(ene) may be a "lower alkyl(ene)," wherein the alkyl(ene) group has 1 to 4 hydrocarbons. For example, lower alkyl may include methyl, ethyl, propyl, isopropyl, butyl, and iso-butyl, while lower alkylene may include methylene (—$CH_2$—), ethylene (—$CH_2CH_2$—), propylene (—$CH_2CH_2CH_2$—), isopropylene (—CH($CH_3$)$_2$—), butylene (—$CH_2CH_2CH_2CH_2$—), iso-butylene (—C($CH_3$)$_2CH_2$—) and the like. The term $C_x$ alkyl refers to an alkyl with x carbon atom(s), and thus, the term $C_1$-$C_6$ alkyl refers to any alkyl having from 1 to 6 carbon atoms.

The term "phenylalkylene" refers to a phenyl-substituted alkylene, as defined herein. The phenyl ring may unsubstituted or substituted, for example, with one or more (e.g., one, two or three) of a halo, hydroxyl, allyl, aryl, ester, epoxy, alkoxy and/or alkyl group, as defined herein. Exemplary phenylalkylene include phenylmethylene (—CH(Ph)-) and hydroxyphenylalkylene. The term "hydroxyphenylalkylene" refers to a hydroxyphenyl-substituted alkylene, as defined herein. Exemplary hydroxyphenylalkylene groups include hydroxyphenylmethylene (—CH(Ph-OH)—), hydroxyphenylethylene (—$CH_2$CH(Ph-OH)—) and the like. The hydroxyl group of a hydroxyphenylalkylene may be attached at any position of the phenyl ring (i.e., ortho, meta or para positions).

The term "phenyldialkylene" refers to a bivalent radical of the formula —$R_1$-Ph-$R_2$—, wherein $R_1$ and $R_2$ are each independently alkylene groups, as defined herein, and Ph is a bivalent phenylene radical (—$C_6H_4$—). The alkylene groups may be attached at any position on the phenylene ring, and the ring may be unsubstituted or substituted, for example, with one or more (e.g., one, two or three) of an halo, ester, alkoxy, epoxy, alkyl, allyl, aryl and/or hydroxyl (—OH) group, as defined herein. Exemplary phenyldialkylene groups may include phenyldimethylene (—$CH_2$—$C_6H_4$—$CH_2$—), phenyldiethylene (—$CH_2CH_2$—$C_6H_4$—$CH_2CH_2$—) and the like.

The term "biphenyldialkylene" refers to a bivalent radical of the formula —$R_1$-Ph-Ph-$R_2$—, wherein Ph represents a phenylene group (—$C_6H_4$—) and $R_1$ and $R_2$ are alkyl, as defined herein. The phenyl rings may unsubstituted or substituted, for example, with one or more (e.g., one, two or three) of a halo, ester, aryl, alkoxy, epoxy, hydroxyl, alkyl, allyl or the like. Exemplary biphenyldialklyene include biphenyldimethylene, biphenyldiethylene and the like.

The terms "aryl" and "arylene" refer to a monovalent or bivalent (respectively) aromatic radical, which may optionally include 1 to 3 additional rings (e.g. cycloalkyl) fused thereto. An aryl(ene) ring may optionally be unsubstituted or substituted, for example, with one or more (e.g., one, two or three) of an halo, alkyl, aryl, ester, alkoxy, epoxy, allyl and/or hydroxyl group, or a chromophore or crosslinking functionality. Exemplary aryl(ene) groups may include phenyl, biphenyl, hydroxyphenyl and the like. The term $C_x$ aryl refers to an aryl having x carbon atoms, so that the term $C_6$-$C_{10}$ aryl refers to any aryl group having from 6 to 10 carbon atoms.

The term "polymer component" refers to a polymer or mixture of polymers that include one or more of the recited monomeric units. Thus, the polymer component may include only one type of polymer or copolymer, or it may include a mixture of more than one polymer or copolymer. For example, the polymer component may include a single polymer that consists or consists essentially of the monomeric units of Formulas I, II or III. Alternatively, the polymer component may include copolymers (block or random), that include the monomeric units of Formula I, II and/or III, and optionally may include other monomeric units. Further, the polymer component may also include mixtures or blends of polymers, including compositions whereby one or more of the polymers of the polymer component do not include the monomeric units of Formula I, II or III.

The term "crosslinking component" refers to a compound, polymer or the like, that may react with crosslinking functionalities of polymer(s) of the invention, in order to crosslink the polymer(s). The crosslinks may be formed between one type of polymer, or they may be formed between different types of polymer chains. Exemplary crosslinking components may include etherified amino resins, such as methylated melamine resins and butylated melamine resins (e.g. N-methoxymethyl or N-butoxymethyl melamine resins (available at Cytec Industries, Inc.)); etherified amino resins, such as methylated urea resins and butylated urea resins (e.g. Cymel U-65 and UFR 80); methylated/butylated glycoluril compounds (e.g. Powderlink 1174 (Cytec Industries, Inc.)); the compounds described in Canadian Patent No. 1,204,547, which is incorporated herein by reference; 2,6-bis(hydroxymethyl)-p-cresol; the compounds described in Japanese Patent Laid-Open No. 1-293339 and bis-epoxy compounds.

The term "acid catalyst" refers to any known acid catalyst, and may be, in some embodiments, a common organic acid, such as p-toluenesulfonic acid monohydrate. In addition, in some embodiments, the acid catalyst may be an acid generator, whereby an acid is produced by under certain conditions. For example, the acid catalyst may be a thermal acid generator (TAG) whereby an acid is generated upon thermal treatment. Exemplary TAGs may include pyridine p-toluenesulfonic acid, 2,4,4,6-tetrabromocyclohexadienol, benzoin tosylate, 2-nitrobenzyl tosylate, and other alkyl esters of organic sulfonic acids. In some embodiments, a photoacid generator (PAG) may be used as the acid catalyst, whereby an acid is produced upon irradiation with a particular radiation source. Exemplary PAGs may include those described in U.S. Pat. Nos. 5,886,102 and 5,939,236, which are both incorporated herein by reference.

The term "crosslinking functionality" refers to a functional group of a polymer of an embodiment of the invention that is capable of reacting with the crosslinking component to crosslink the polymer(s). Exemplary crosslinking functionalities may include hydroxyl and epoxide groups.

The term "chromophore" refers to any suitable chromophore, and preferably a chromophore suitable for radiation at 193 and/or 248 nm. Exemplary chromophores include phenyl, chrysenyl, pyrenyl, fluoranthrenyl, anthronyl, benzophenonyl, thioxanthonyl, anthracenyl, and anthracenyl derivatives that act as chromophores. Exemplary anthracenyl derivatives may include 9-anthracenyl methanol. In some embodiments, the chromophore contains no nitrogen, and, in other embodiments, the only nitrogen present is in the form of a deactivated amino nitrogen, such as a phenol thiazine.

The phrase "any combination thereof" refers to an embodiment where two or more of the recited components are present. When the term "any combination thereof" is used in reference to a listing of possible components, e.g., acid catalysts, it is meant that two or more of the recited acid catalysts may be used in combination. Further, when the phrase is used in describing a listing of functional groups, it is meant to include embodiments where any of the functional groups are independently present, if applicable, and also to include embodiments where the functional groups are used in combination. For example, a listing of "phenylalkylene, phenyldialkylene and biphenyldialkylene" refers to any suitable combination of the substituents, including, for example, wherein a group includes both a phenyldialkylene and a phenylalkylene in combination (e.g., —CH(Ph)-CH$_2$-Ph-CH$_2$—).

In some embodiments of the present invention, antireflective hardmask compositions include:

a) a polymer component, which includes one or more of the monomeric units of Formulas I, II and III:

Formula (I)

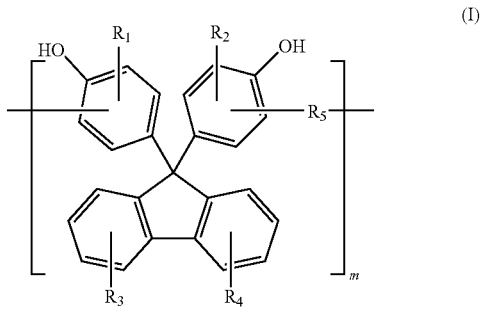

wherein $R_1$ and $R_2$ may each independently be hydrogen, hydroxyl, alkyl, aryl, allyl, halo or any combination thereof; and $R_3$ and $R_4$ may each independently be hydrogen, a crosslinking functionality, a chromophore or any combination thereof; and $R_5$ may be phenylalkylene, phenyldialkylene or biphenyldialkylene, and m is a positive integer;

Formula (II)

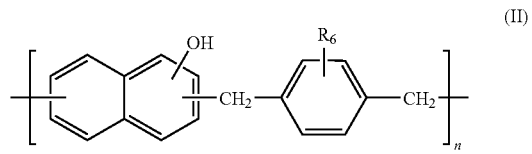

wherein $R_6$ may be hydrogen, alkyl, aryl, allyl or any combination thereof, and n is a positive integer; and Formula (III)

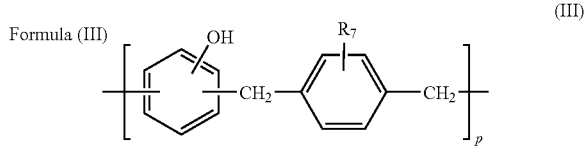

wherein $R_7$ may be hydrogen, alkyl, aryl, allyl, or any combination thereof, and p is a positive integer; and b) a crosslinking component; and c) an acid catalyst.

In some embodiments of the present invention, antireflective hardmask compositions include the monomeric unit of Formula I.

In some embodiments of the present invention, $R_1$ and $R_2$ may each independently be hydrogen, hydroxyl, $C_{1-10}$ alkyl, $C_{6-10}$ aryl, allyl or halo; and $R_3$ and $R_4$ may each independently be hydrogen, a crosslinking functionality or a chromophore;

$R_5$ may be hydroxyphenylmethylene, phenyldimethylene or biphenyldimethylene; and $R_6$ and $R_7$ may each independently be hydrogen, $C_{6-10}$ alkyl, $C_{6-10}$ aryl and allyl.

In some embodiments, m, n and p are each independently in a range of from about 1 to 190.

In some embodiments, the antireflective hardmask compositions include about 1 to about 20 weight percent polymer component; about 0.1 to about 5 weight percent crosslinking component; and about 0.001 to about 0.05 weight percent acid catalyst. The remaining weight percent of the composition may include a solvent, preferably an organic solvent, and/or a surfactant. Exemplary solvents may include propylene glycol monomethyl ether acetate (PGMEA) and other solvents commonly used with resists.

In some embodiments, the polymer component includes a polymer that includes the monomeric unit of Formula I, wherein the polymer has a weight average molecular weight in a range of about 1,000 to about 30,000. In some embodiments, the polymer component includes a polymer that includes the monomeric unit of Formula II, wherein the polymer has a weight average molecular weight in a range of about 1,000 to about 30,000. In some embodiments, the polymer component includes a polymer that includes the monomeric unit of Formula III, wherein the polymer has a weight average molecular weight in a range of about 1,000 to about 30,000.

In some embodiments, the chromophore may be phenyl, chrysenyl, pyrenyl, fluoranthrenyl, anthronyl, benzophenonyl, thioxanthonyl, anthracenyl, anthracenyl derivative or any combination thereof.

In some embodiments, the crosslinking component may be a melamine resin, an amino resin, a glycoluril compound, a bisepoxy compound or any combination thereof.

The acid catalyst may catalyze the crosslinking component with the crosslinking functionality of a polymer of an embodiment of the invention. In some embodiments, the acid catalyst may be p-toluenesulfonic acid monohydrate, pyridinium p-toluenesulfonate, 2,4,4,6-tetrabromocyclohexadienone, an alkyl ester of an organic sulfonic acid or any combination thereof. The alkyl ester of an organic sulfonic acid may include benzoin tosylate, 2-nitrobenzyl tosylate or any combination thereof.

In some embodiments of the present invention, methods of forming a patterned material layer on a substrate include (a) forming an antireflective hardmask layer on a material layer, wherein said hardmask layer comprises a composition of an embodiment of the invention;

(b) forming a radiation-sensitive imaging layer on the antireflective layer;

(c) exposing the imaging layer to radiation;

(d) developing the imaging layer and the antireflective layer to expose portions of the material layer; and (e) etching the exposed portions of the material layer.

In some embodiments of the invention, the method can be carried out in accordance with the following procedure. First, a material to be patterned (e.g., an aluminum or silicon nitride) may be formed onto a silicon substrate by any technique known in the art. In particular embodiments, the material to be patterned may be conductive, semi-conductive, magnetic, or insulative. A hardmask composition according to an embodiment of the present invention may then be spin-coated onto the material. In some embodiments, the composition may be spin-coated to a thickness in a range of about 500 to about 4000 Å. The hardmask composition may then be baked, for example, at a temperature in the range of about 100 to about 300° C., and in some embodiments, for a time in a range of about 10 seconds to about 10 minutes, to form a hardmask layer. A radiation-sensitive imaging layer may then be formed on the hardmask layer. The imaging layer may then be developed by exposing portions of the resist to radiation in order to form a pattern on the imaging layer. The imaging layer and the antireflective hardmask layer may then be selectively removed to expose portions of the material layer. Etching may then be performed. In some embodiments, dry etching is performed using a gas, for example, a $CHF_3/CF_4$ mixture. After the formation of a patterned material layer, the remaining portions of the resist may be removed using a common photoresist stripper.

Accordingly, hardmask compositions of the present invention and the resulting lithographic structures may be used in the fabrication and design of integrated circuit devices in semiconductor manufacture. The compositions and methods of embodiments of the present invention may be used, for example, in the formation of patterned material structures, such as metal wirings, holes for contacts and biases, insulating sections (e.g. damascene trenches and shallow trench isolation) and trenches for capacitor structures. Thus, in some embodiments of the invention, a semiconductor integrated circuit fabricated according to a method of the invention is provided.

A better understanding of the present invention may be obtained in light of the following examples which are set forth to illustrate, but are not to be construed to limit the present invention.

EXAMPLES

Example 1

Synthesis of Compound (1)

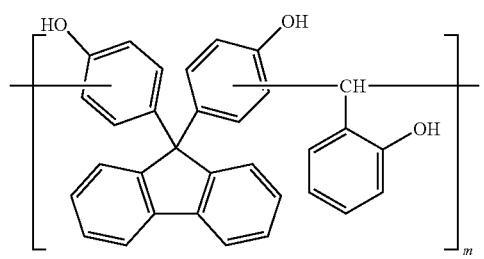

Into a 1 L four-neck flask equipped with a mechanical stirrer, a cooling pipe, a 300 ml dropping funnel, and a nitrogen gas inlet pipe, a solution of 28.03 g (0.08 mol) of 4,4'-(9- fluorenylidene)diphenol and 0.3 g of p-toluenesulfonic acid dissolved in 200 g of γ-butyrolactone was loaded, and the flask was heated in an oil bath stirred using a magnetic stirrer, while nitrogen gas was supplied. When the internal temperature of the reaction solution reached 100° C., a solution of 7.94 g of 2-hydroxybenzaldehyde dissolved in 100 g of 1-methoxy-2-propanol was slowly added in droplets over 30 min through the dropping funnel, and the reaction mixture was allowed to react for 12 hr. After the completion of the reaction, the reactor was cooled to room temperature, and then methylamineketone (MAK) was added to the reaction solution until the concentration was 20 wt %. The solution was washed three times with water using a 3 L separatory funnel, and was then concentrated using an evaporator. The resultant solution was diluted using MAK and methanol, to form a 15 wt % solution having MAK and methanol (at a 4:1 weight ratio). This solution was loaded into a 3 L separatory funnel, after which n-heptane was added to remove a low molecular weight material and/or monomer, thus yielding a desired phenol resin ($M_w$=12,000, polydispersity=1.9, m=22).

Example 2

Synthesis of Compound (2)

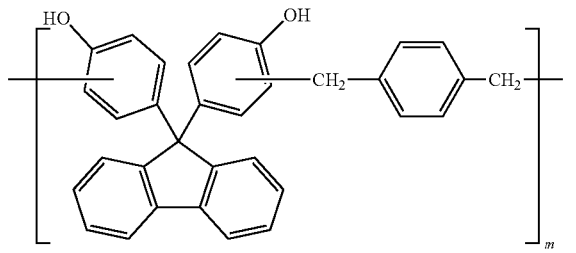

Figure 2:
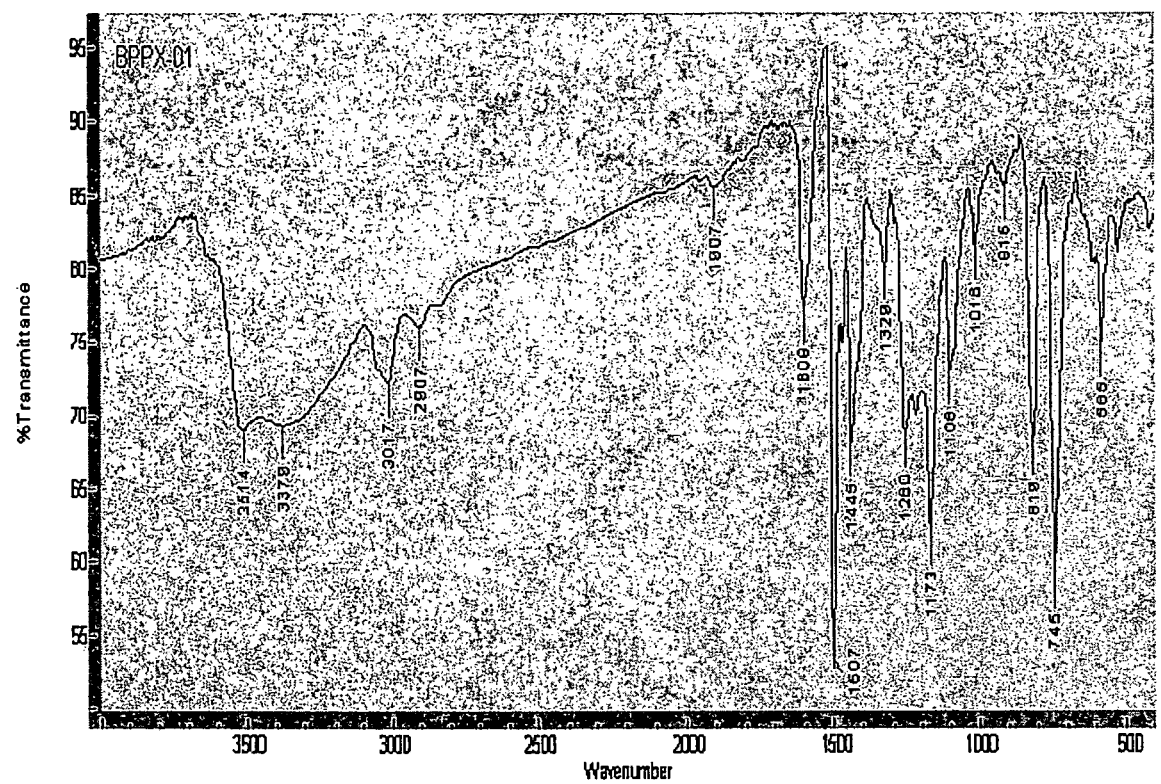
FIG. 2 is an FT-IR spectrum of the polymer prepared in Example 2.

Into a 1 L four-neck flask equipped with a mechanical stirrer, a cooling pipe, a 300 mL dropping funnel, and a nitrogen gas inlet pipe, 8.31 g (0.05 mol) of 1,4-bis(methoxymethyl)benzene, 0.154 g (0.001 mol) of diethylsulfate, and 200 g of γ-butyrolactone were loaded and stirred while nitrogen gas was supplied. After 10 min, a solution of 28.02 g (0.08 mol) of 4,4'-(9-fluorenylidene)diphenol dissolved in 200 g of γ-butyrolactone was slowly added in droplets over 30 min, and the reaction mixture was allowed to react for 12 hr. After the completion of the reaction, the resultant reaction solution was treated with water to remove the acid therefrom, and then concentrated using an evaporator. The concentrated solution was diluted using MAK and methanol, to form a 15 wt % solution having MAK and methanol (at a 4:1 weight ratio). This solution was loaded into a 3 L separatory funnel, after which n-heptane was added to remove a low molecular weight material containing monomer, thus yielding a desired phenol resin ($M_w$=12,000, polydispersity=2.0, m=23). In addition, $^1$H-NMR spectrum and FT-IR spectrum of the synthesized phenol resin were measured. The resulting spectra are provided in FIGS. 1 and 2, respectively.

Example 2-1

Synthesis of Compound (3)

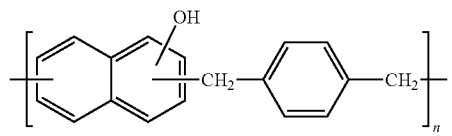

Into a 1 L four-neck flask equipped with a mechanical stirrer, a cooling pipe, a 300 ml dropping funnel, and a nitrogen gas inlet pipe, 8.31 g (0.05 mol) of 1,4-bis(methoxymethyl)benzene, 0.154 g (0.001 mol) of diethylsulfate, and 200 g of γ-butyrolactone were loaded and stirred while nitrogen gas was supplied. After 10 min, a solution of 11.54 g (0.08 mol) of 1-naphthol dissolved in 200 g of γ-butyrolactone was slowly added in droplets over 30 min, and the reaction mixture was allowed to react for 12 hr. After the completion of the reaction, the resultant reaction solution was treated with water to remove the acid therefrom, and then concentrated using an evaporator. The concentrated solution was diluted using MAK and methanol, to form a 15 wt % solution having MAK and methanol (at a 4:1 weight ratio). This solution was loaded into a 3 L separatory funnel, after which n-heptane was added to remove a low molecular weight material containing monomer, thus yielding a desired phenol resin ($M_w$=11,500, polydispersity=2.4, n=44).

Example 2-2

Synthesis of Compound (4)

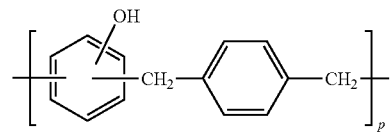

Into a 1 L four-neck flask equipped with a mechanical stirrer, a cooling pipe, a 300 mL dropping funnel, and a nitrogen gas inlet pipe, 8.31 g (0.05 mol) of 1,4-bis(methoxymethyl)benzene, 0.154 g (0.001 mol) of diethylsulfate, and 200 g of γ-butyrolactone were loaded and stirred while nitrogen gas was supplied. After 10 min, a solution of 7.53 g (0.08 mol) of phenol dissolved in 200 g of γ-butyrolactone was slowly added in droplets over 30 min, and the reaction mixture was allowed to react for 12 hr. After the completion of the reaction, the resultant reaction solution was treated with water to remove the acid therefrom, and then concentrated using an evaporator. The concentrated solution was diluted using MAK and methanol, to form a 15 wt % solution having MAK and methanol (at a 4:1 weight ratio). This solution was loaded into a 3 L separatory funnel, after which n-heptane was added to remove a low molecular weight material containing monomer, thus yielding a desired phenol resin ($M_w$=10,300, polydispersity=2.3, p=48).

Example 3

Synthesis of Compound (5)

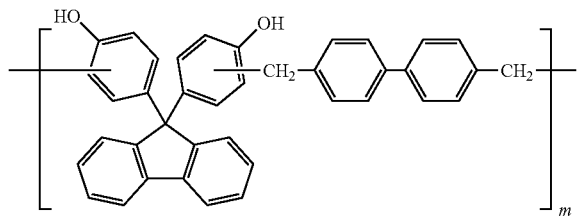

Into a 1 L four-neck flask equipped with a mechanical stirrer, a cooling pipe, a 300 ml dropping funnel, and a nitrogen gas inlet pipe, 12.56 g (0.05 mol) of 4,4'-bis(chloromethyl)-1,1'-biphenyl, 26.66 g of aluminum chloride, and 200 g of γ-butyrolactone were loaded and stirred while nitrogen gas was supplied. After 10 min, a solution of 35.03 g (0.10 mol) of 4,4'-(9-fluorenylidene)diphenol dissolved in 200 g of γ-butyrolactone was slowly added in droplets over 30 min, and the reaction mixture was allowed to react for 12 hr. After the completion of the reaction, the resultant reaction solution was treated with water to remove the acid therefrom, and then concentrated using an evaporator. The concentrated solution was diluted using MAK and methanol, to form a 15 wt % solution having MAK and methanol (at a 4:1 weight ratio). This solution was loaded into the 3 L separatory funnel, after which n-heptane was added to remove a low molecular weight material containing monomer, thus yielding a desired phenol resin ($M_w$=4100, m=7-8).

Comparative Example 1

Synthesis of Compound (6)

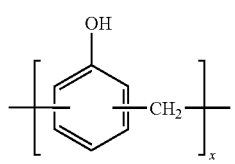

Into a 1 L four-neck flask equipped with a mechanical stirrer, a cooling pipe, a 300 ml dropping funnel, and a nitrogen gas inlet pipe, a solution of 7.52 g (0.08 mol) of phenol and 0.3 g of p-toluenesulfonic acid dissolved in 200 g of γ-butyrolactone was loaded, and the flask was heated in an oil bath stirred using a magnetic stirrer, while nitrogen gas was supplied. When the internal temperature of the reaction solution reached 100° C., 5.27 g (0.065 mol) of an aqueous solution of 37 wt % formaldehyde were slowly added in droplets over 30 min through the dropping funnel, and the reaction mixture was allowed to react for 12 hr. After the completion of the reaction, the reactor was cooled to room temperature, and then MAK was added to the reaction solution until the concentration was 20 wt %. The solution was washed three times with water using a 3 L separatory funnel, and then concentrated using an evaporator. The resultant solution was diluted using MAK and methanol, to form a 15 wt % solution having MAK and methanol (at a 4:1 weight ratio). This solution was loaded into a 3 L separatory funnel, after which n-heptane was added to remove a low molecular weight material containing monomer, thus yielding a desired phenol resin ($M_w$=6000, x=55~56).

Example 4

0.8 g of the polymer prepared in Example 1, 0.2 g of an oligomeric crosslinking agent (Powderlink 1174) represented by the following repeating structural unit, and 2 mg of pyridinium P-toluene sulfonate were dissolved in 9 g of propyleneglycolmonoethylacetate (PGMEA) to obtain a reaction solution, which was then filtered to prepare a sample solution.

Example 5

0.8 g of the polymer prepared in Example 2, 0.2 g of a crosslinking agent (Powderlink 1174), and 2 mg of pyridinium P-toluene sulfonate were dissolved in 9 g of PGMEA to obtain a reaction solution, which was then filtered to prepare a sample solution.

Example 5-1

0.8 g of the polymer prepared in Example 2-1, 0.2 g of a crosslinking agent (Powderlink 1174), and 2 mg of pyridinium P-toluene sulfonate were dissolved in 9 g of PGMEA to obtain a reaction solution, which was then filtered to prepare a sample solution.

Example 5-2

0.8 g of the polymer prepared in Example 2-2, 0.2 g of a crosslinking agent (Powderlink 1174), and 2 mg of pyridinium P-toluene sulfonate were dissolved in 9 g of PGMEA to obtain a reaction solution, which was then filtered to prepare a sample solution.

Example 6

0.8 g of the polymer prepared in Example 3, 0.2 g of a crosslinking agent (Powderlink 1174), and 2 mg of pyridinium P-toluene sulfonate were dissolved in 9 g of PGMEA to obtain a reaction solution, which was then filtered to prepare a sample solution.

Comparative Example 2

0.8 g of the polymer prepared in Comparative Example 1, 0.2 g of a crosslinking agent (Cymel 303), and 2 mg of pyridinium P-toluene sulfonate were dissolved in 9 g of PGMEA to obtain a reaction solution, which was then filtered to prepare a sample solution.

Example 7

Each of the samples prepared in Examples 4 to 6 and Comparative Example 2 was applied on a silicon wafer using a spin coating process, and then baked at 200° C. for 60 sec, to form a film 1500 Å thick,

Example 8

The refractive index (n) and extinction coefficient (k) of each of the films prepared in Example 7 were measured. For this, an Ellipsometer (available from J. A. Woollam Co., Inc.) was used. The results are given in Table 1 below.

TABLE 1

| Sample for Film Formation | Optical Property (193 nm) | | Optical Property (248 nm) | |
|---|---|---|---|---|
| | n (Refractive Index) | k (Extinction Coefficient) | n (Refractive Index) | k (Extinction Coefficient) |
| Ex. 4 | 1.45 | 0.85 | 2.00 | 0.28 |
| Ex. 5 | 1.44 | 0.87 | 2.02 | 0.27 |
| Ex. 5-1 | 1.47 | 0.80 | 2.01 | 0.25 |
| Ex. 5-2 | 1.30 | 0.75 | 2.00 | 0.15 |
| Ex. 6 | 1.47 | 0.75 | 1.81 | 0.29 |
| Comp. Ex. 2 | 1.29 | 0.74 | 2.01 | 0.05 |

Example 9

Each of the samples prepared in Examples 4 to 6 and Comparative Example 2 was applied on a silicon wafer coated with aluminum using a spin coating process, and then baked at 200° C. for 60 sec, to form a film 1500 Å thick.

Example 10

Each of the films prepared in Example 9 was coated with a KrF photoresist, baked at 110° C. for 60 sec, exposed using an exposure instrument (ASML XT:1400, NA 0.93) and then developed using teteramethylammonium hydroxide (TMAH, 2.38 wt % aq. solution). Subsequently, a 90 nm sized line and space pattern was observed using an FE-SEM. The results are given in Table 2 below. The EL (Expose Latitude) margins, varying with the exposure amount, and DoF (Depth of Focus) margins, varying with the distance from a light source, were measured. The results are shown in Table 2 below.

TABLE 2

| | Pattern Property | |
|---|---|---|
| Sample for Film Formation | EL Margin (ΔmJ/exposure energy mJ) | DoF Margin (μm) |
| Ex. 4 | 0.1 | 0.1 |
| Ex. 5 | 0.2 | 0.2 |
| Ex. 5-1 | 0.1 | 0.2 |
| Ex. 5-2 | 0.1 | 0.1 |
| Ex. 6 | 0.1 | 0.1 |
| Comp. Ex. 2 | 0 | 0 |

Example 11

Each of the samples patterned in Example 10 was dry etched using a gas mixture of $CHF_3$ and $CF_4$, and then further dry etched using a gas mixture of $BCl_3$ and $Cl_2$. Finally, the remaining organics were removed using $O_2$ gas, and the section of the sample was observed using an FE-SEM. The results are given in Table 3 below.

TABLE 3

| Sample for Film Formation | Etched Pattern Feature |
|---|---|
| Ex. 4 | Vertical |
| Ex. 5 | Vertical |
| Ex. 5-1 | Vertical |
| Ex. 5-2 | Vertical (Slightly Tapered) |
| Ex. 6 | Vertical |
| Comp. Ex. 2 | Tapered |

Example 12

Each of the samples prepared in Example 7 was dry etched using a gas mixture of $CHF_3$ and $CF_4$. The thickness difference before and after the etching process was measured. The results are given in Table 4 below.

TABLE 4

| Sample for Film Formation | $CHF_3/CF_4$ Gas Etching Rate (nm/min) |
|---|---|
| Ex. 4 | 98 |
| Ex. 5 | 93 |
| Ex. 5-1 | 100 |
| Ex. 5-2 | 110 |
| Ex. 6 | 99 |
| Comp. Ex. 2 | 170 |

Example 13

Each of the samples prepared in Examples 4 to 6 and Comparative Example 2 was applied on a silicon wafer coated with SiN (silicon nitride) using a spin coating process, and then baked at 200° C. for 60 sec, to form a film 1500 Å thick.

Example 14

Each of the films prepared in Example 13 was coated with an ArF photoresist, baked at 110° C. for 60 sec, exposed using an ArF exposure instrument ASML1250 (FN70 5.0 active, NA 0.82) and then developed using TMAH (2.38 wt % aq. solution). Subsequently, an 80 nm sized line and space pattern was observed using an FE-SEM. The results are given in Table 5 below. The EL margins, varying with the exposure amount, and DoF margins, varying with the distance from a light source, were measured. The results are shown in Table 5 below.

TABLE 5

| | Pattern Property | |
|---|---|---|
| Sample for Film Formation | EL Margin (ΔmJ/exposure energy mJ) | DoF Margin (μm) |
| Ex. 4 | 0.1 | 0.2 |
| Ex. 5 | 0.1 | 0.2 |
| Ex. 5-1 | 0.1 | 0.2 |
| Ex. 5-2 | 0.1 | 0.1 |
| Ex. 6 | 0.1 | 0.2 |
| Comp. Ex. 2 | 0 | 0 |

Example 15

Each of the samples patterned in Example 14 was dry etched using a gas mixture of $CHF_3$ and $CF_4$, and then further dry etched using a gas mixture of $CHF_3$ and $CF_4$ having a different ratio. Finally, the remaining organics were removed using $O_2$ gas, and the section of the sample was observed using an FE-SEM. The results are given in Table 6 below.

TABLE 6

| Sample for Film Formation | Etched Pattern Shape |
|---|---|
| Ex. 4 | Vertical |
| Ex. 5 | Vertical |
| Ex. 5-1 | Vertical |
| Ex. 5-2 | Slightly Tapered |
| Ex. 6 | Vertical |
| Comp. Ex. 2 | Tapered |

As described hereinbefore, the present invention provides a hardmask composition having antireflective properties. The composition of the present invention is advantageous because it can be applied using a spin-on application technique while exhibiting excellent optical properties, mechanical properties, and etching selectivity. In addition, this composition has a long storage lifetime, over which an acid pollutant minimally exists or does not exist.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

The invention claimed is:

1. An antireflective hardmask composition comprising
 (a) a polymer component, comprising the monomeric unit of Formula I, and further comprising the monomeric unit of Formula II and/or the monomeric unit of Formula III:

Formula (I)

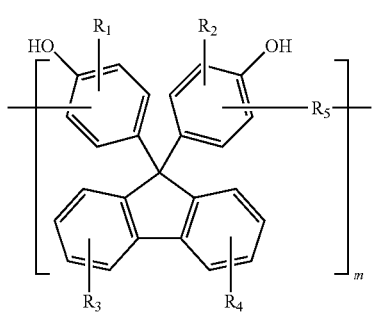

wherein $R_1$ and $R_2$ are each independently selected from the group consisting of hydrogen, hydroxyl, alkyl, aryl, allyl, halo and any combination thereof; and
$R_3$ and $R_4$ are each independently selected from the group consisting of hydrogen, a crosslinking functionality, a chromophore and any combination thereof;
$R_5$ is selected from the group consisting of phenylalkylene, phenyldialkylene, hydroxyphenylalkylene and biphenyldialkylene, and m is a positive integer;

Formula (II)

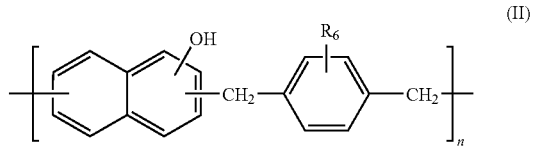

wherein $R_6$ is selected from the group consisting of hydrogen, alkyl, aryl, allyl and any combination thereof, and n is a positive integer; and Formula (III)

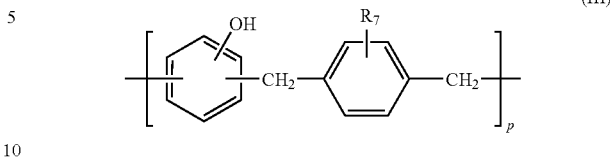

wherein $R_7$ is selected from the group consisting of hydrogen, alkyl, aryl, allyl and any combination thereof, and p is a positive integer;
 (b) a crosslinking component; and
 (c) an acid catalyst.

2. The composition of claim 1, wherein
 $R_1$ and $R_2$ are each independently selected from the group consisting of hydrogen, hydroxyl, $C_{1-10}$ alkyl, $C_{6-10}$ aryl, allyl and halo;
 $R_3$ and $R_4$ are each independently selected from the group consisting of hydrogen, a crosslinking functionality and a chromophore;
 $R_5$ is selected from the group consisting of hydroxyphenylmethylene, phenyldimethylene and biphenyldimethylene; and
 $R_6$ and $R_7$ are each independently selected from the group consisting of hydrogen, $C_{1-10}$ alkyl, $C_{6-10}$ aryl and allyl.

3. The composition of claim 1, wherein m, n and p are each independently in a range of from about 1 to about 190.

4. The hardmask composition of claim 1, comprising
 about 1 to about 20 weight percent polymer component;
 about 0.1 to about 5 weight percent crosslinking component; and
 about 0.001 to about 0.05 weight percent acid catalyst.

5. The composition of claim 1, wherein the polymer component comprises a polymer comprising the monomeric unit of Formula II, wherein the polymer has a weight average molecular weight in a range of about 1,000 to about 30,000.

6. The composition of claim 1, wherein the polymer component comprises a polymer comprising the monomeric unit of Formula III, wherein the polymer has a weight average molecular weight in a range of about 1,000 to about 30,000.

7. The composition of claim 1, further comprising an organic solvent.

8. The composition of claim 1, further comprising a surfactant.

9. The composition of claim 1, wherein the crosslinking component is selected from the group consisting of a melamine resin, an amino resin, a glycoluril compound, a bisepoxy compound and any combination thereof.

10. The composition of claim 1, wherein the acid catalyst is selected from the group consisting of p-toluenesulfonic acid monohydrate, pyrididium p-toluenesulfonate, 2,4,4,6-tetrabromocyclohexadienone, an alkyl ester of an organic sulfonic acid and any combination thereof.

11. The composition of claim 1, wherein the chromophore is a functional group selected from the group consisting of phenyl, chrysenyl, pyrenyl, fluoranthrenyl, anthronyl, benzophenonyl, thioxanthonyl, anthracenyl, anthracenyl derivative and any combination thereof.

12. The composition of claim 10, wherein the alkyl ester of an organic sulfonic acid is selected from the group consisting of benzoin tosylate, 2-nitrobenzyl tosylate and any combination thereof.

* * * * *